United States Patent
Tu et al.

(10) Patent No.: US 9,618,415 B2
(45) Date of Patent: Apr. 11, 2017

(54) PRESSURE SENSOR PACKAGE

(71) Applicants: LINGSEN PRECISION INDUSTRIES, LTD., Taichung (TW); UNISENSE TECHNOLOGY CO., LTD., Hsinchu (TW)

(72) Inventors: Ming-Te Tu, Taichung (TW); Chao-Wei Yu, Taichung (TW); Chih-Ming Liu, Taichung (TW)

(73) Assignees: LINGSEN PRECISION INDUSTRIES, LTD., Taichung (TW); UNISENSE TECHNOLOGY CO., LTD., Hsinchu (TW)

( * ) Notice: Subject to any disclaimer, the term of this patent is extended or adjusted under 35 U.S.C. 154(b) by 306 days.

(21) Appl. No.: 14/617,049

(22) Filed: Feb. 9, 2015

(65) Prior Publication Data

US 2016/0116359 A1    Apr. 28, 2016

(30) Foreign Application Priority Data

Oct. 28, 2014  (TW) .............................. 103138878 A

(51) Int. Cl.
  *G01L 7/00*   (2006.01)
  *G01L 19/14*  (2006.01)
  *G01L 19/06*  (2006.01)

(52) U.S. Cl.
  CPC ........ *G01L 19/147* (2013.01); *G01L 19/0618* (2013.01)

(58) Field of Classification Search
  CPC .............. G01L 19/147; G01L 19/0007; G01L 19/0618; G01L 7/00; G01L 19/0084; H01L 35/173

USPC .................................. 73/756, 700, 753, 750
See application file for complete search history.

(56) References Cited

U.S. PATENT DOCUMENTS

| | | | | |
|---|---|---|---|---|
| 5,436,491 A | * | 7/1995 | Hase | ................... G01L 19/0084 257/417 |
| 6,441,503 B1 | * | 8/2002 | Webster | .............. G01L 19/0645 257/417 |
| 6,951,136 B2 | * | 10/2005 | Kato | ..................... G01L 19/147 73/754 |
| 8,104,356 B2 | * | 1/2012 | Lu | ......................... G01L 19/141 73/715 |

(Continued)

*Primary Examiner* — Lisa Caputo
*Assistant Examiner* — Nigel Plumb
(74) *Attorney, Agent, or Firm* — Muncy, Geissler, Olds & Lowe, P.C.

(57) ABSTRACT

A pressure sensor package includes a substrate providing a connection port, a support member mounted on the substrate by compression molding and having a gap cut through opposing top and bottom walls thereof to expose the connection port, a sensor chip mounted on the support member and electrically connected to the connection port, an encapsulating cover covered on the support member and defining therein an accommodation chamber that accommodates the sensor chip and a through hole that is disposed in communication with the accommodation chamber for the passing of an external signal therethrough to the sensor chip. Thus, the support member steadily carries the sensor chip and isolates stress arising from the external environment, thereby reducing stress interference with the sensor chip and enhancing the overall performance of the pressure sensor package.

8 Claims, 3 Drawing Sheets

(56) References Cited

U.S. PATENT DOCUMENTS

| | | | | |
|---|---|---|---|---|
| 8,327,715 B2* | 12/2012 | Bradley | ................... | G01L 1/18 |
| | | | | 73/774 |
| 8,501,517 B1* | 8/2013 | Yow | ....................... | H01L 21/50 |
| | | | | 257/E21.504 |
| 8,686,550 B2* | 4/2014 | McDonald | ......... | H01L 23/3157 |
| | | | | 257/666 |
| 2008/0164583 A1* | 7/2008 | Tien | ....................... | H01L 23/04 |
| | | | | 257/659 |
| 2008/0164602 A1* | 7/2008 | Tien | ..................... | B81B 7/0064 |
| | | | | 257/704 |

* cited by examiner

PRESSURE SENSOR PACKAGE

BACKGROUND OF THE INVENTION

1. Field of the Invention

The present invention relates to semiconductor packaging technology and more particularly, to a pressure sensor package.

2. Description of the Related Art

A pressure sensor uses a pressure sensor chip to measure the numerical amount of the pressure of a received gas or liquid by means of an electronic type precision induction. Thus, the stability of the pressure sensor chip determines the performance of the pressure sensor. However, the package structure is an important factor that determines the stability of the sensor chip. FIG. 1 illustrates a pressure sensor package 1 according to the prior art. According to this design, the pressure sensor package uses a substrate 2 and an upper plastic sheet member 3 having a relatively lower Young's modulus to carry a pressure sensor chip 4. Because the substrate and the upper plastic sheet member are thin components, the package cannot provide a strong carrier platform for the pressure sensor chip. Further, because the pressure sensor chip is a sensitive sensing element, if the upper plastic sheet member cannot fully isolate stress arising from the external environment, or, the substrate and the upper plastic sheet member cannot effectively resist against the environmental stress, the environmental stress will be directly transmitted to the pressure sensor chip to interfere with the performance of the pressure sensor chip or to lower its stability. An improvement in this regard is necessary.

SUMMARY OF THE INVENTION

The present invention has been accomplished under the circumstances in view. It is the main object of the present invention to provide a pressure sensor package, which uses a support member to steadily carry a sensor chip and to isolate stress arising from the external environment, thereby reducing stress interference with the sensor chip and enhancing the overall performance of the pressure sensor package.

To achieve this and other objects of the present invention, a pressure sensor package of the invention comprises a substrate, a support member, a sensor chip, and an encapsulating cover. The substrate comprises a connection port. The support member is mounted on the substrate by compression molding, comprising a gap cut through opposing top and bottom walls thereof and facing toward the connection port to expose the connection port. The sensor chip is mounted on the support member and electrically connected to the connection port. The encapsulating cover comprises an accommodation chamber, and a through hole in communication with the accommodation chamber. The encapsulating cover is mounted on the support member over the sensor chip to keep the sensor chip in the accommodation chamber.

Further, the sensor chip and the connection port are electrically connected together by a bonding wire for intercommunication.

Preferably, the gap is disposed near one peripheral side of the substrate and deviated from vertical alignment with the through hole.

Preferably, the support member further comprises a tapered surface surrounding the gap and gradually increasing in diameter in direction from the substrate toward the encapsulating cover.

Preferably, the pressure sensor package further comprises a processing chip mounted on the substrate within the support member, wherein the substrate further comprises a communication port electrically connected with the processing chip.

Preferably, the processing chip and the communication port are electrically connected together by a bonding wire for intercommunication.

Preferably, the encapsulating cover is a metal structure.

Preferably, the through hole is disposed above the sensor chip.

Thus, the use of the support member enables the pressure sensor package to steadily carry the sensor chip and to isolate stress arising from the external environment, thereby reducing stress interference with the sensor chip and enhancing the overall performance of the pressure sensor package.

Other advantages and features of the present invention will be fully understood by reference to the following specification in conjunction with the accompanying drawings, in which like reference signs denote like components of structure.

DETAILED DESCRIPTION OF THE INVENTION

Figure 1:
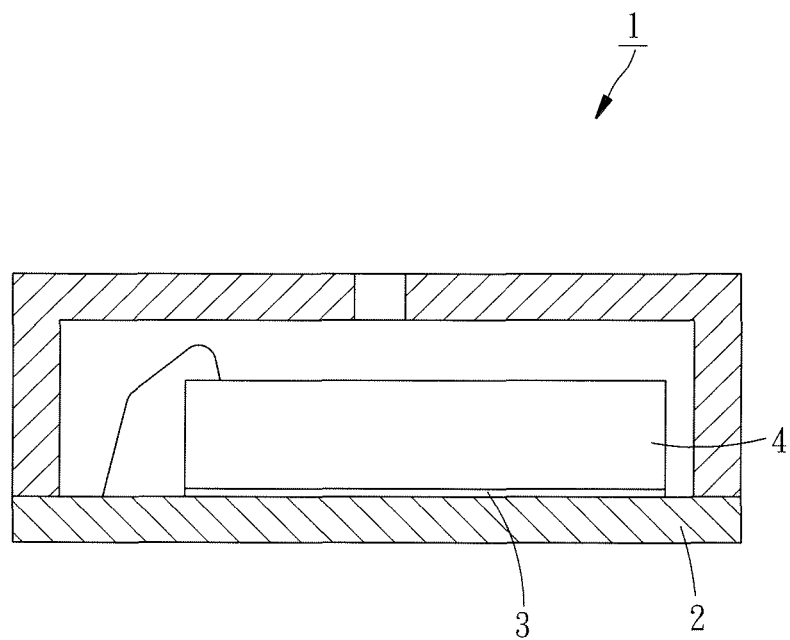
FIG. 1 is schematic sectional view of a pressure sensor package according to the prior art.
Figure 2:
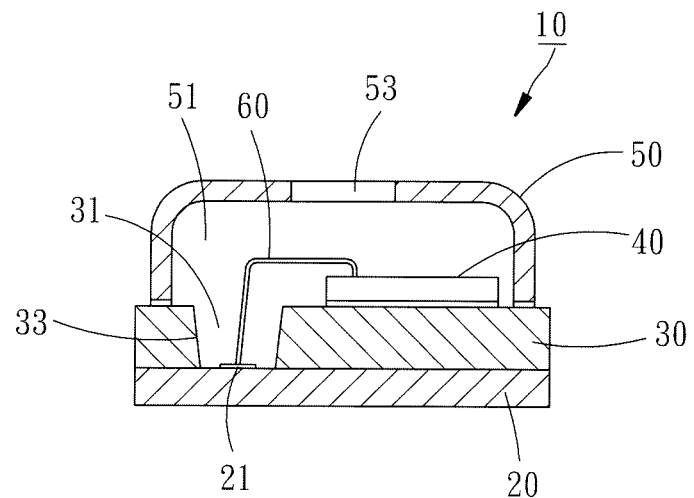
FIG. 2 is a sectional view of a pressure sensor package in accordance with a first embodiment of the present invention.
Figure 3:
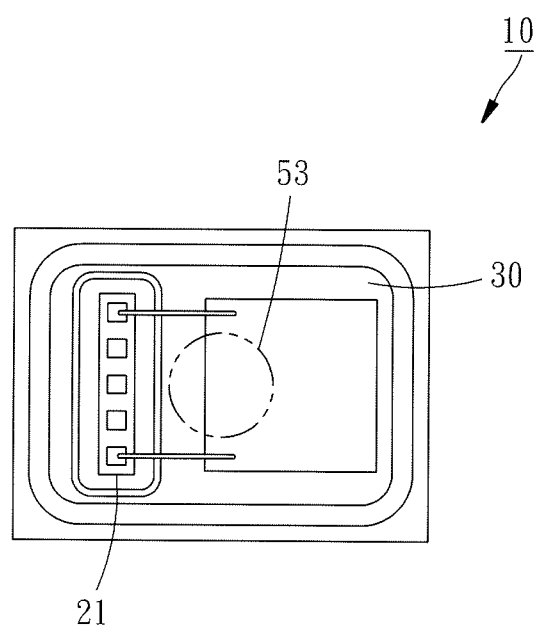
FIG. 3 is a top view of the pressure sensor package in accordance with the first embodiment of the present invention, illustrating the relative positioning of the sensor chip, the gap, the connection port and the through hole when viewed through the encapsulating cover.

Referring to FIGS. 2 and 3, a pressure sensor package 10 in accordance with a first embodiment of the present invention is shown. The pressure sensor package 10 comprises a substrate 20, a support member 30 bonded to the substrate 20, a sensor chip 40 bonded to the support member 30, and an encapsulating cover 50 covering the sensor chip 40.

The substrate 20 provides a connection port 21.

The support member 30 is mounted on the substrate 20 by compression molding, defining therein a gap 31 that cut through opposing top and bottom walls of the support member 30. The gap 31 faces toward the connection port 21, enabling the connection port 21 to be exposed to the outside. More specifically, the gap 31 is disposed near one peripheral side of the substrate 20. Further, the support member 30 is mounted on the substrate 20 by compression molding. In order to facilitate stripping of the support member 30 from the mold, the support member 30 is configured to provide a tapered surface 33 gradually increasing in diameter in direction from the substrate 20 toward the encapsulating cover 50. As illustrated in FIG. 2, in order to achieve the effects of high strength and high stability, compression molding is employed to mold the support member 30 on the substrate 20 in a protruded manner. It is to be noted that, unlike the upper plastic sheet material 3 of the prior art design that is made by conductive plastics or any other plastic material of low Young's modulus, the support member 30 is made by a resin having a high Young's modulus, and thus, the support member 30 has better impact strength against external environmental stress, such as better bending strength.

The sensor chip 40 is mounted on the support member 30, and electrically connected to the connection port 21 with a bonding wire by wire bond for intercommunication. In this embodiment, the sensor chip is a pressure sensor.

The encapsulating cover 50 is a metal structure for protection against electromagnetic magnetic interference (EMI), comprising an accommodation chamber 51 and a through hole 53 in communication with the accommodation chamber 51. The encapsulating cover 50 is mounted on the support member 30 and covered over the sensor chip 40. The through hole 53 is disposed above the sensor chip 40 without aiming at the gap 31. Thus, the sensor chip 40 can receive an external pressure signal via the through hole 53 and convert it into an electric signal, and then transmits the electric signal through the bonding wire 60 to the substrate 20 for further application.

Figure 4:
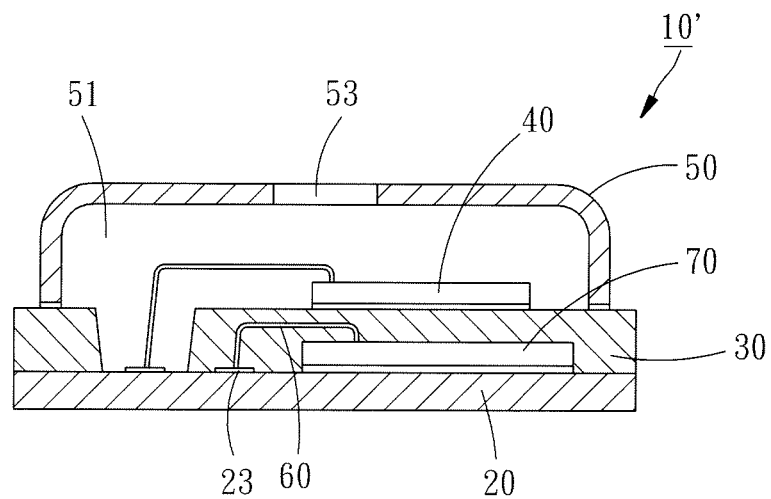
FIG. 4 is a sectional view of a pressure sensor package in accordance with a second embodiment of the present invention.
Figure 5:
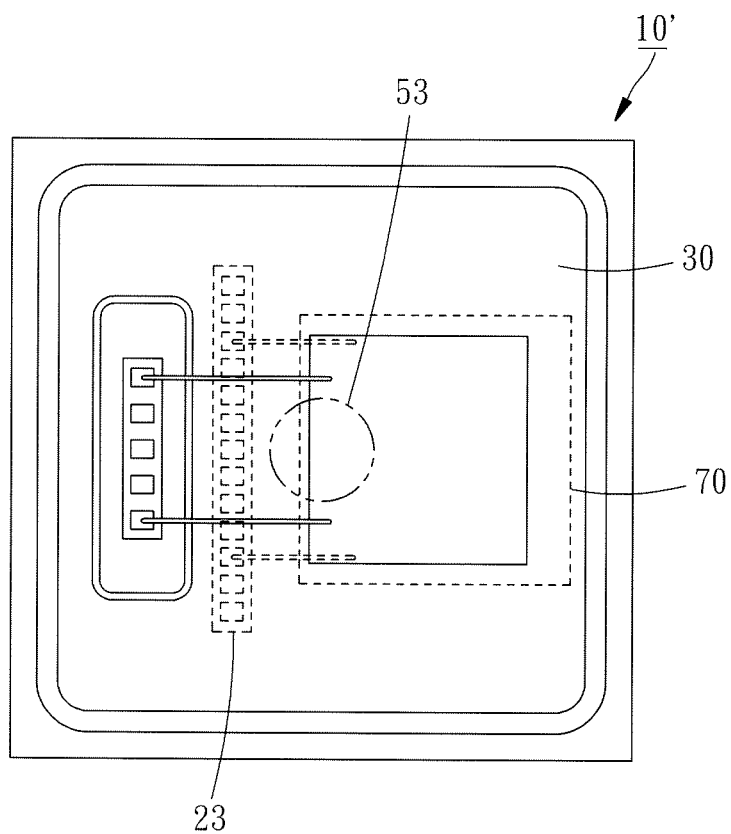
FIG. 5 is a top view of the pressure sensor package in accordance with the second embodiment of the present invention, illustrating the relative positioning of the sensor chip, the processing chip, the gap, the connection port, the communication port and the through hole when viewed through the encapsulating cover.

Referring to FIGS. 4 and 5, a pressure sensor package 10' in accordance with a second embodiment of the present invention is shown. Similar to the aforesaid first embodiment, this pressure sensor package 10' also comprises a substrate 20, a support member 30 mounted on the substrate 20, a sensor chip 40 mounted on the support member 30, and an encapsulating cover 50 covered on the support member 30 over the sensor chip 40. The main feature of this second embodiment is that the pressure sensor package 10' further comprising a processing chip 70 mounted on the substrate 20 within the support member 30. In order for enabling the signal of the processing chip 70 to be communicated with the substrate 20, the substrate 20 is configured to provide a communication port 23. The processing chip 70 is electrically connected to the communication port 23 for signal communication between the processing chip 70 and the substrate 20. Although the processing chip 70 is mounted on the substrate 20 unlike the mounting arrangement of the sensor chip 40 on the support member 30, the support member 30 provides the substrate 20 with a strong structure, enabling the substrate 20 to resist against bending or deformation caused by an external environmental stress. Therefore, the stacked sensor chip 40 and processing chip 70 can still be well carried and protected by the support member 30, maintaining optimal performance like the aforesaid first embodiment. In this second embodiment, the connection between the processing chip 70 and the communication port 23 is also achieved through a bonding wire 60.

In conclusion, the pressure sensor package 10,10' uses the strong support member 30 to steadily support the sensor chip 70 and to isolate stress arising from the external environment, reducing stress interference with the sensor chip 70 and enhancing the performance of the pressure sensor.

Although particular embodiments of the invention have been described in detail for purposes of illustration, various modifications and enhancements may be made without departing from the spirit and scope of the invention. Accordingly, the invention is not to be limited except as by the appended claims.

What is claimed is:

1. A pressure sensor package, comprising:
   a substrate comprising a connection port;
   a support member mounted on said substrate by compression molding, said support member comprising a gap cut through opposing top and bottom walls thereof and facing toward said connection port to expose said connection port;
   a sensor chip mounted on said support member and electrically connected to said connection port; and
   an encapsulating cover comprising an accommodation chamber and a through hole in communication with said accommodation chamber, said encapsulating cover being mounted on said support member over said sensor chip to keep said sensor chip in said accommodation chamber.

2. The pressure sensor package as claimed in claim 1, further comprising a bonding wire electrically connected between said sensor chip and said connection port for allowing communication between said sensor chip and said connection port.

3. The pressure sensor package as claimed in claim 1, wherein said gap is disposed near one peripheral side of said substrate and deviated from vertical alignment with said through hole.

4. The pressure sensor package as claimed in claim 1, wherein said support member further comprises a tapered surface surrounding said gap and gradually increasing in diameter in direction from said substrate toward said encapsulating cover.

5. The pressure sensor package as claimed in claim 1, further comprising a processing chip mounted on said substrate within said support member, wherein said substrate further comprises a communication port electrically connected with said processing chip.

6. The pressure sensor package as claimed in claim 5, further comprising a bonding wire electrically connected between said processing chip and said communication port for allowing communication between said processing chip and said communication port.

7. The pressure sensor package as claimed in claim 5, wherein said encapsulating cover is a metal structure.

8. The pressure sensor package as claimed in claim 1, wherein said through hole is disposed above said sensor chip.

* * * * *